(12) United States Patent
Taguchi (10) Patent No.: US 7,279,749 B2
(45) Date of Patent: Oct. 9, 2007

(54) SEMICONDUCTOR DEVICE AND SEMICONDUCTOR MEMORY USING THE SAME

(75) Inventor: Kazuo Taguchi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 168 days.

(21) Appl. No.: 10/924,995

(22) Filed: Aug. 25, 2004

(65) Prior Publication Data

US 2005/0077576 A1   Apr. 14, 2005

(30) Foreign Application Priority Data

Sep. 1, 2003  (JP)  ............... 2003-308254
Feb. 4, 2004  (JP)  ............... 2004-028120

(51) Int. Cl.
*H01L 27/01* (2006.01)
*H01L 27/12* (2006.01)
*H01L 31/0392* (2006.01)

(52) U.S. Cl. ..................................... 257/347
(58) Field of Classification Search ................. 257/347
See application file for complete search history.

(56) References Cited

U.S. PATENT DOCUMENTS

2004/0207017 A1* 10/2004 Matsumoto et al. ........ 257/347

FOREIGN PATENT DOCUMENTS

| JP | A 11-274323 | 10/1999 |
|---|---|---|
| JP | A-2000-114536 | 4/2000 |
| JP | A 2000-183178 | 6/2000 |
| JP | A-2001-119024 | 4/2001 |
| JP | A 2001-217325 | 8/2001 |
| JP | A 2002-246600 | 8/2002 |
| JP | A 2002-329789 | 11/2002 |

* cited by examiner

*Primary Examiner*—Sara Crane
*Assistant Examiner*—Samuel A. Gebremariam
(74) *Attorney, Agent, or Firm*—Oliff & Berridge, PLC (57) ABSTRACT

Aspects of the invention can provide a semiconductor device and a semiconductor memory using the semiconductor device having a gate shape by which the width of the gate can be realized as designed even if relative shifts occur between the masks for forming the field regions and the gate patterns. The semiconductor device can include, in field regions, a gate (an H-type gate), a gate insulating film right under the gate, a body region right under the gate insulating film, and source/drain regions formed on both sides of and across the body region. The H-type gate can have a first section extending along the channel width direction on the field region, and a pair of second sections formed on both ends of the first section in the channel width direction and extending along the channel length direction, and is formed to be an H shape in plan view. Since a part of each of the pair of second sections of the H-type gate can be formed on a part of the field region having a constant length in the channel length direction, the channel width can be defined by the length of the first section.

19 Claims, 7 Drawing Sheets

SEMICONDUCTOR DEVICE AND SEMICONDUCTOR MEMORY USING THE SAME

BACKGROUND OF THE INVENTION

1. Field of Invention

Aspects of the invention relate to a semiconductor device formed on a SOI (Silicon On Insulator) substrate or on a bulk substrate and a semiconductor memory using the semiconductor device.

2. Description of Related Art

As a shape of the gate on related field of transistors, in addition to the I-type gate used for bulk substrates, the T-type gate used for obtaining the body contact in the SOI substrates can be used. I-type gates are advantageous in that they have small gate capacitance and that they require the minimum sell areas. However, I-type gates are not effective for obtaining the body contact in SOI substrates. In this respect, the T-type gates are effective for separating the source/drain regions from the body contact regions even if the surfaces of field regions in SOI substrates are formed of silicide layers. However, there is a disadvantage that the width of the gate channels of transistors cannot be made constant if the mask shift occurs. Further, it has not been studied to ease the soft error problems caused by such as α lays, γ lays, or neutrons by modifying the shape of gates.

SUMMARY OF THE INVENTION

Aspects of the invention can have an advantage of providing a semiconductor device and a semiconductor memory using the semiconductor device having a gate shape by which the width of the gate can be realized as designed even if relative shifts occur between the masks for forming the field regions and the gate patterns.

Another advantage of the invention is to provide a semiconductor device and a semiconductor memory using the semiconductor device capable of easing the soft error problems caused by such as α lays, γ lays, or neutrons by modifying the shape of gates.

Still another advantage of the invention is to provide a semiconductor device and a semiconductor memory using the semiconductor device having a larger freedom of the body contact positions for transistors on the SOI substrates.

An exemplary semiconductor device according to one aspect of the invention can include, in a field region, a gate, a gate insulating film disposed right under the gate, a body region disposed right under the gate insulating film, and source/drain regions formed on both sides of the body region, wherein the gate comprises a first section extending on the field region along the channel width direction, and a pair of second sections formed on both ends of the first section in the channel width direction and extending along the channel length direction, and is formed as an H-type gate in plan view. According to the semiconductor device of the invention, as long as a part of each of the pair of second sections of the H-type gate is formed on the field region having a constant length in the channel length direction, the channel width can be defined by the length of the first section even if there is a relative position shift between a mask for forming the field region and a mask for forming the gate pattern. As a result, the channel width can be provided as designed.

In the exemplary semiconductor device according to the invention, the H-type gate can be implemented, thus enabling the gate capacitance to be set larger than those of I-type gates or T-type gates having the same channel width and the same channel length. The larger gate capacitance is generally disadvantageous in view of the operation speed and power consumption. However, it is advantageous for addressing the problems that can be solved by delaying operations of the transistors. For example, it is effective for a measure against soft errors. By delaying operations of transistors, the inversion speed of the signal potential in response to entrance of a single-shot α lay is slowed to provide time for recombination of the charge generated by the α lay prior to the complete inversion of the potential, thus contributing to avoid the signal potential inversion.

In the semiconductor device according to the invention, the field region can be formed on a SOI substrate. In this case, a body contact can be disposed on the field region across one of the pair of second sections of the H-type gate from the first section. In particular, even if a low resistance layer is formed on a surface of the field region, the body contact region can be separated and insulated from the source/drain region by the second section. Further, since the body contact region can be disposed adjacent either one of the pair of second sections of the H-type gate, larger freedom of the layout of the body contact region than the conventional T-type gates can be provided.

In the semiconductor device according to the invention, the field region can be formed on a bulk substrate. In case of the bulk substrate, except for the point that the body contact regions are not necessary for every transistor, the H-type gate functions as measures for the mask shift and the soft error as is the case with the SOI substrate.

Another aspect of the invention can be an application to a semiconductor memory in which a memory cell is formed of at least a pair of drive transistors and a pair of transmitting transistors. In this case, at least one of the transistors forming the memory cell is formed of the H-type gate mentioned above.

Preferably, each of the pair of transmitting transistors has the H-type gate. Because the ratio of the gate widths of the pair of transmitting transistors can be realized as designed. In this case, the pair of H-type gates of the pair of transmission transistors are formed as a continuing pattern inside and outside of the field region. According to this, a trouble of connecting the gates with a wiring can be saved.

In the exemplary semiconductor memory according to the invention, loads to be respectively connected to the pair of drive transistors can be formed by a pair of load transistors. In this case, each of the pair of load transistors and each of the pair of drive transistors can include the H-type gate. According to this, the ratio of the channel widths of the gates of the load transistor and the drive transistor connected to each other in series can be set constant to ensure a push-pull operation as designed for CMOS inverters.

Further, one of the pair of H-type gates of one of the pair of load transistors and one of the pair of H-type gates of one of the pair of drive transistors connected in series to the one of the pair of load transistors can be formed as a continuing pattern inside and outside of the field region. Likewise, the other of the pair of H-type gates of the other of the pair of load transistors and the other of the pair of H-type gates of the other of the pair of drive transistors connected in series to the other of the pair of load transistors can be formed as a continuing pattern inside and outside of the field region.

BRIEF DESCRIPTION OF THE DRAWINGS

This invention will be described with reference to the accompanying drawings, wherein like numerals reference like elements, and wherein.

DETAILED DESCRIPTION OF PREFERRED EMBODIMENTS

Hereinafter, an exemplary embodiment of the invention is described referring to the accompanying drawings.

Figure 1:
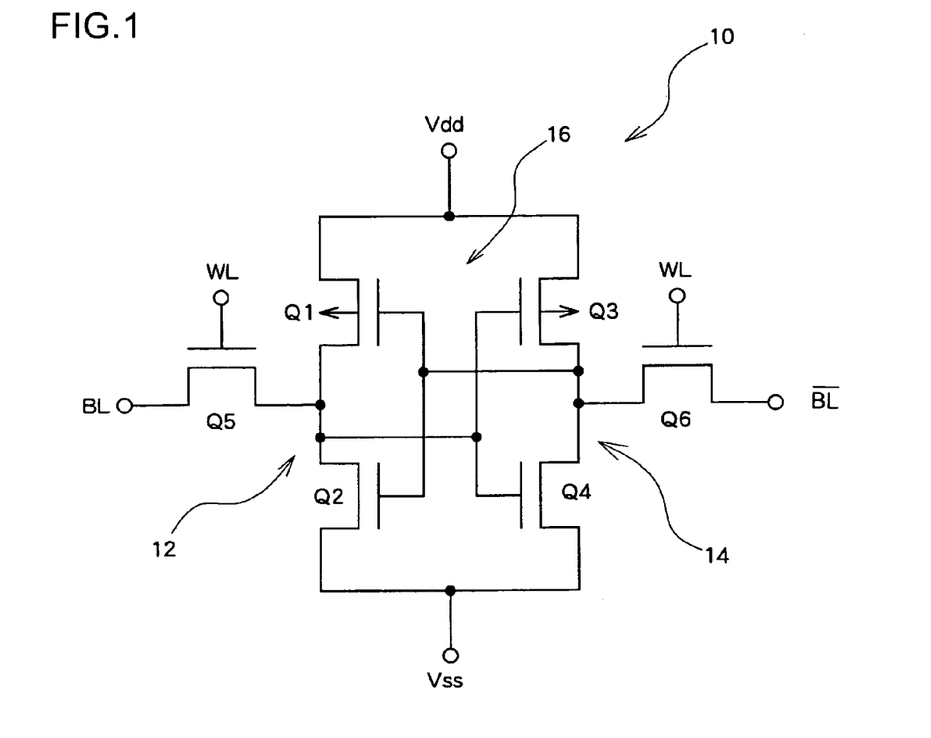
FIG. 1 is an equivalent circuit diagram showing a memory cell of SRAM according to an embodiment of the present invention.

FIG. 1 is an equivalent circuit of one of memory cells of an SRAM as an exemplary semiconductor memory according to the invention. A memory cell 10 of the SRAM is composed of six MOS field effect transistors. One P-channel load transistor Q1 and one N-channel drive transistor Q2 serially connected thereto form a first CMOS inverter 12. The other P-channel load transistor Q3 and the other N-channel drive transistor Q4 connected in series thereto form a second CMOS inverter 14. A Vdd power source line is connected to the sources of the pair of P-channel load transistors Q1, Q3 while a Vss power source line is connected to the sources of the pair of N-channel drive transistors Q2, Q4. And, by cross-coupling the first and the second CMOS inverters, a flip-flop 16 is formed. The flip-flop 16 is connected to a bit line BL and an inverted bit line $\overline{BL}$ via pair of N-channel transmission transistors Q5, Q6 that are turned on or turned off in accordance with a potential of a word line WL.

Note that the memory call can additionally include other transistors than the six MOS field effect transistors mentioned above. Alternatively, the load transistors Q1, Q3 can be replaced with loads other than transistors.

Figure 2:
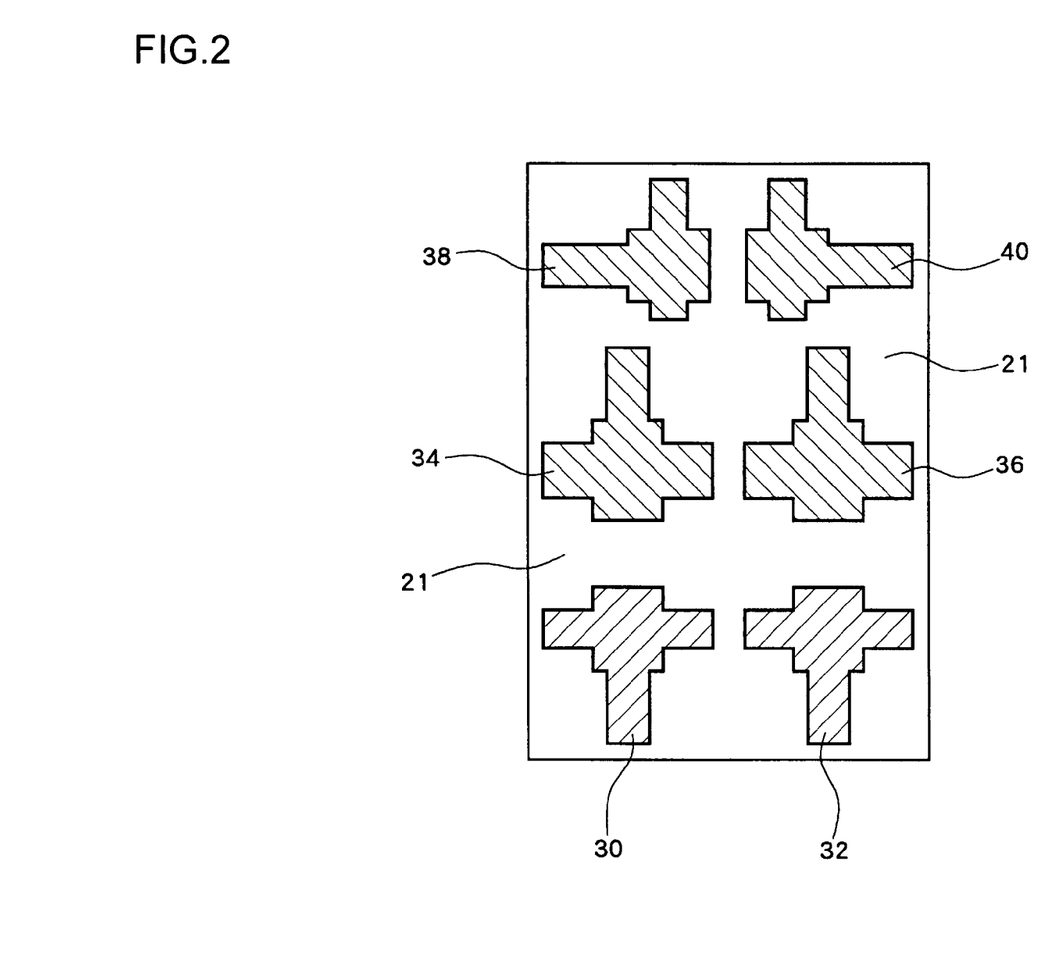
FIG. 2 is a plan view showing field regions of the memory cell shown in FIG. 1.
Figure 3:
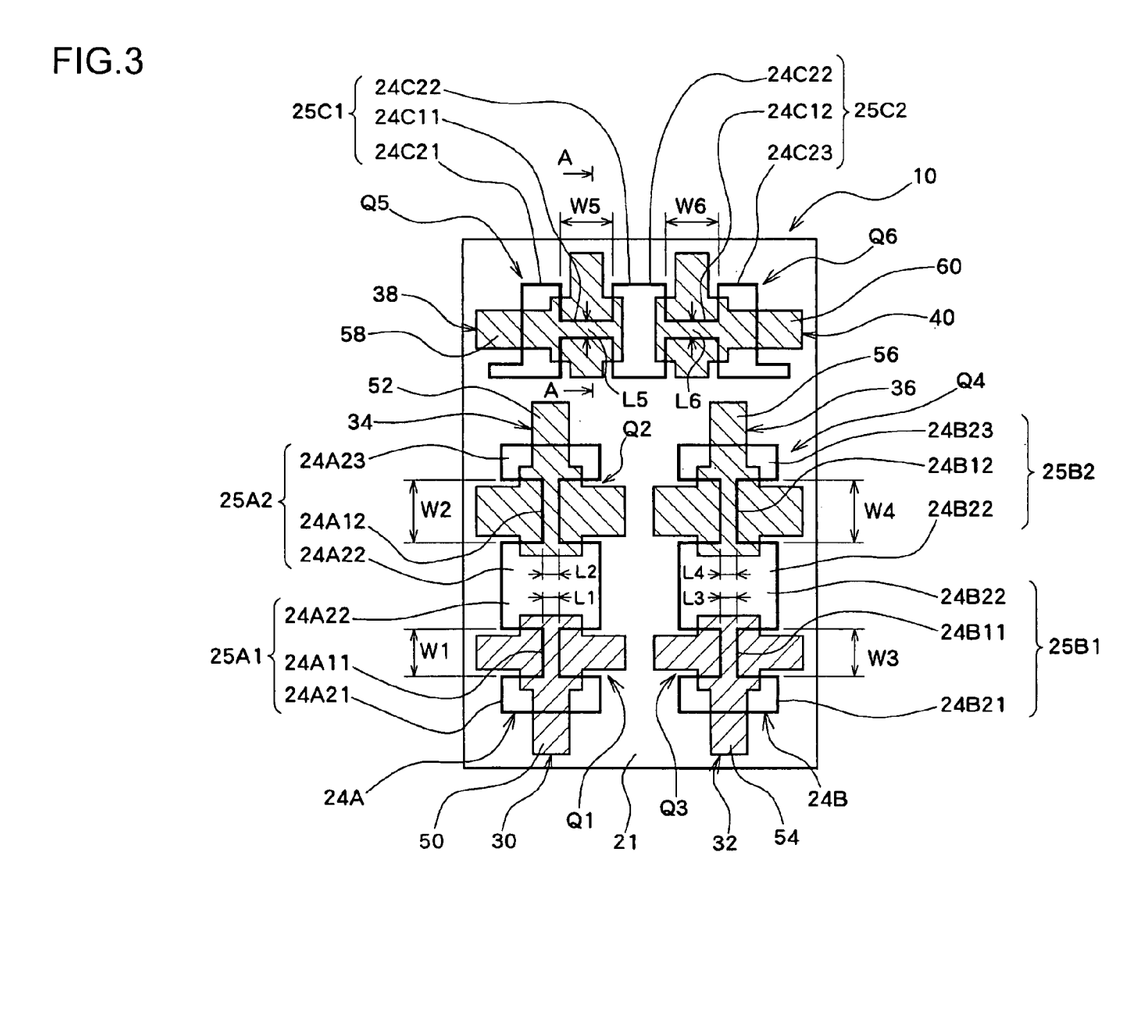
FIG. 3 is a plan view showing gate regions formed on the field regions shown in FIG. 2.
Figure 4:
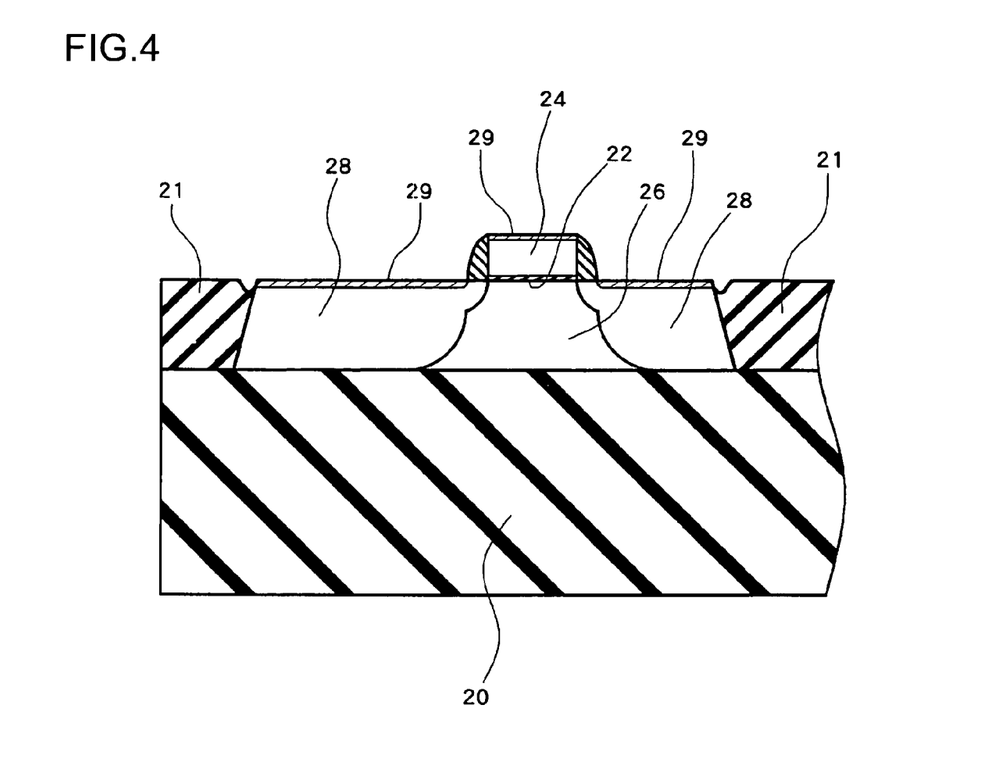
FIG. 4 is a cross-sectional view along the A-A arrow shown in FIG. 3.

FIG. 2 is a plan view of field regions of the memory cell shown in FIG. 1, and FIG. 3 is a plan view showing gate regions formed on the field regions shown in FIG. 1. FIG. 4 is a cross-sectional view along the arrows A-A in FIG. 3.

The exemplary embodiment is, as shown in FIG. 4, a semiconductor device having an SOI structure. Namely, a semiconductor layer (e.g., an amorphous silicon layer) is formed on an insulating substrate 20. In this case, the periphery of each of the field regions of the six transistors forming one memory cell is insulated from each other by, for example, STI (Shallow Trench Isolation) 21 as shown in FIGS. 2 through 4. Further, since especially the SOI structure is used, the bottom of each of the field regions is insulated from each other by the insulating substrate 20 as shown in FIG. 4. Note that the present invention is effective for bulk substrates as described below.

In the lower part of FIG. 2, there are formed field regions 30, 32 for the P-channel load transistors Q1, Q3. In the middle part of FIG. 2, there are formed field regions 34, 36 for the N-channel drive transistors Q2, Q4. In the upper part of FIG. 2, there are formed field regions 38, 40 for the N-channel transmission transistors Q5, Q6. Each of these field regions 30 through 40 is insulated by an STI 21 or the like.

Gates are formed over inside and outside of the field regions 30 through 40. As shown in the cross-sectional view of FIG. 4, a gate 24 is formed on the field region via a gate insulating film 22. Note that in the exemplary embodiment, the gate 24 is formed of, for example, a polysilicon layer. Further, a semiconductor layer right under the gate 24 and the gate insulating film 22 shown in FIG. 4 forms a body (also referred to as a channel) 25. After forming the gate 24, impurity is injected to semiconductor layers positioned at both sides of and across the body 26 using the gate 24 as a mask to form source and drain regions 28. Further, in the embodiment, surfaces of the gate 24 and the source/drain regions 28 are formed as low resistance layers 29 such as a silicide layer. Note that a surface of body contact region described below connected to the body 26 to be exposed is also formed as a low resistance below, such as a silicide layer.

In FIG. 3, in one memory cell 10, there are formed three gate patterns 24A through 24C. The first gate pattern 24A is continuously formed elongated in a channel length direction at the field region 30 for the load transistor Q1, the field region 34 for the drive transistor Q2, and the STI region 21 between them. The second gate pattern 24B is continuously formed elongated in a channel length direction at the field region 32 for the load transistor Q3, the field region 36 for the drive transistor Q4, and the STI region between them. The third gate pattern 24C is continuously formed elongated in a channel length direction at the field regions for the pair of transmission transistors Q5, Q6 and the STI region between them. Note that the channel width direction for the transistors Q1 through Q4 is the vertical direction in FIG. 3, the channel length direction thereof is the lateral direction perpendicular thereto. In contrast, the channel width direction for the transistors Q5, Q6 is the lateral direction in FIG. 3, and the channel length direction thereof is the vertical direction perpendicular thereto.

Each of these first through the third gate patterns 24A, 24B, and 24C has respectively a pair of first sections and totally three of second sections (The center one of the second sections is used in common.), thus including a pair of H-type gates. For example, the first gate pattern 24A has the first section 24A11 that functions as a gate with the channel width of W1 and the channel length of L1 on the field region 30 for the load transistor Q1. On both ends of the first section 24A11 in the channel width direction, there are provided the second sections 24A21, 24A22 that are longer than the first section 24A11 in the channel length direction. The first section 24A11 and the pair of the second sections 24A21, 24A22 form a H-type gate 25A1. The first gate pattern 24A further has the first section 24A12 that functions as a gate with the channel width of W2 and the channel length of L2 on the field 34 for the drive transistor Q2. On both ends of the first section 24A12 in the channel width direction, there are provided the second sections 24A22, 24A23 that are longer than the first section 24A12 in the channel length direction. The first section 24A12 and the pair of the second sections 24A22, 24A23 form a H-type gate 25A2.

Likewise, the second gate pattern 24B has a pair of first sections 24B11, 24B12 and three of second sections 24B21, 24B22, 24B23, thus forming a pair of H-type gates 25B1, 25B2. The third gate pattern 24C also has a pair of first sections 24C11, 24C12 and three of second sections 24C21, 24C22, 24C23, thus forming a pair of H-type gates 25C1, 25C2. The first section 24B11 that functions as a gate on the field region 32 for the load transistor Q3 has the channel width of W3 and the channel length of L3. The first section 24B12 that functions as a gate on the field region 36 for the drive transistor Q4 has the channel width of W4 and the channel length of L4. The first section 24C11 that functions as a gate on the field region 38 for the transmission transistor Q5 has the channel width of W5 and the channel length of L5. The first section 24C12 that functions as a gate on the field region 40 for the transmission transistor Q6 has the channel width of W6 and the channel length of L6.

Further, in FIG. 3, projected portions of the field regions beyond the pair of the second sections positioning at the furthest edges of each of the first through the third gate patterns 24A, 24B, 24C form the body contact region described above. Namely, a body contact region 50 is provided at a position projected beyond the second section 24A21 that is one edge of the first gate pattern 24A, a body contact region 52 is provided at a position projected beyond the second section 24A23 that is the other edge thereof. Likewise, a body contact region 54 is provided at a position projected beyond the second section 24B21 that is one edge of the first gate pattern 24B, a body contact region 56 is provided at a position projected beyond the second section 24B23 that is the other edge thereof. Further, a body contact region 58 is provided at a position projected beyond the second section 24C21 that is one edge of the first gate pattern 24C, a body contact region 60 is provided at a position projected beyond the second section 24C23 that is the other edge thereof.

Note that surface layers of the body contact regions 50 through 60 mentioned above are also formed as low resistance layers such as a silicide layer.

In the exemplary embodiment, even if there is a position shift between a mask for forming the field regions and a mask for forming the gate patterns, W1/W2, W3/W4, and W5/W6 can be made constant. Further, on the assumption that the above proportions are constant, the following is possible dependent on the accuracy of the mask for forming the gate patterns.

W1=W3, W2=W4, W5=W6

Note that the gate length of the six transistors is designed as follows.

L1=L2=L3=L4=L5=L6

Figure 5A:
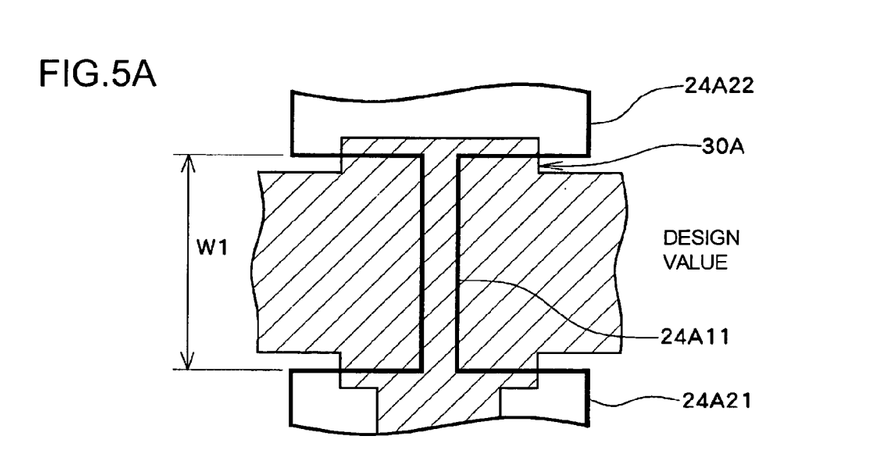
FIGS. 5(A) through 5(C) are schematic views for explaining a reason why the channel width can be obtained as designed with the H-type gates regardless of the mask shift.
Figure 5B:
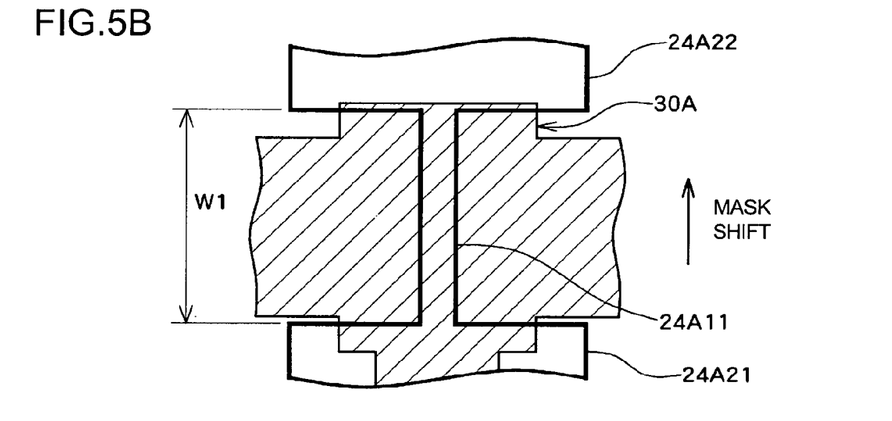
Figure 5C:
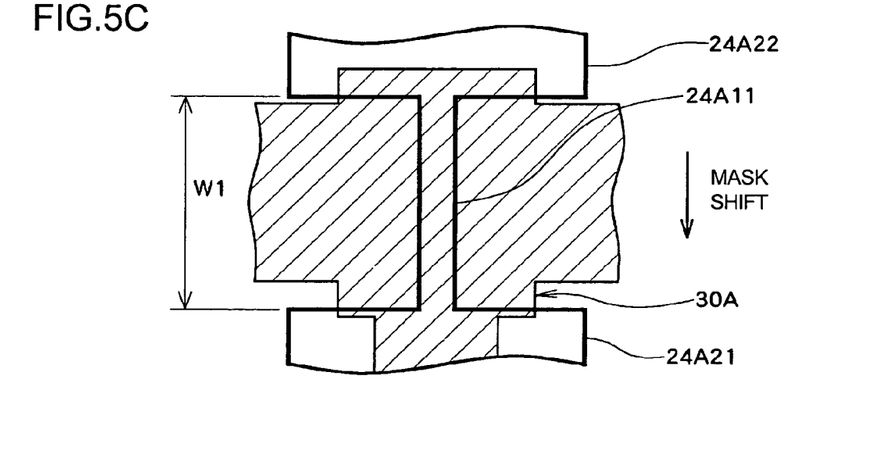

The reason why the above proportions can be made constant is described referring to FIGS. 5(A) through 5(C). FIGS. 5(A) through 5(C) show three cases in which the relative positions of the mask for forming the field region 30 with respect to the mask for forming the first gate pattern 24A are different from each other. While FIG. 5(A) shows the designed positions, FIG. 5(B) shows the case in which the mask for forming the gate patterns shifts upward and FIG. 5(C) shows the case in which the mask for forming the gate patterns shifts downward. In either cases, the respective portions of the pair of the second sections 24A21, 24A22 of the H-type gate 25A1 are formed on a portion 30A of the field region 30, the portion 30A having a constant length in the channel length direction. In this case, the whole of the first section 24A11 of the H-type gate 25A1 is positioned on the field region 30. Therefore, in either cases of FIGS. 5(A) through 5(C), the channel width is defined with the whole length of the first section 24A11. For the same reason, the channel widths W2 through W6 are obtained on the other field regions 32 through 40 as the lengths of the corresponding first sections.

In case the gate lengths L1 through L6 of the six transistors Q1 through Q6 are equal, as is the case with the present embodiment, current drive capacities of the six transistors are determined dependent on the gate widths W1 through W6. Since the first gate pattern 24A determines a push-pull performance of the first inverter 14, the push-pull operation as designed can be realized by making the current drive capacity ratio of the P-type transistor Q1 to the N-type transistor Q2 constant. By adopting the second gate pattern 24B, the push-pull operation of the second inverter 16 can be realized as designed. The third gate pattern 24C determines performances of the switches Q5, Q6 for exchanging charges between the memory cell 10 and the bit line BL or the inverted bit line $\overline{BL}$, wherein it is important that the performance ratio is constant. In the present embodiment, since the mask shift is not necessary to be regarded as a problem, the performance ratio can be realized only dependent on the accuracy of numerical values of W5, W6 of the pair of the first sections 24C11, 24C 12 in the first gate pattern 24C.

Figure 6A:
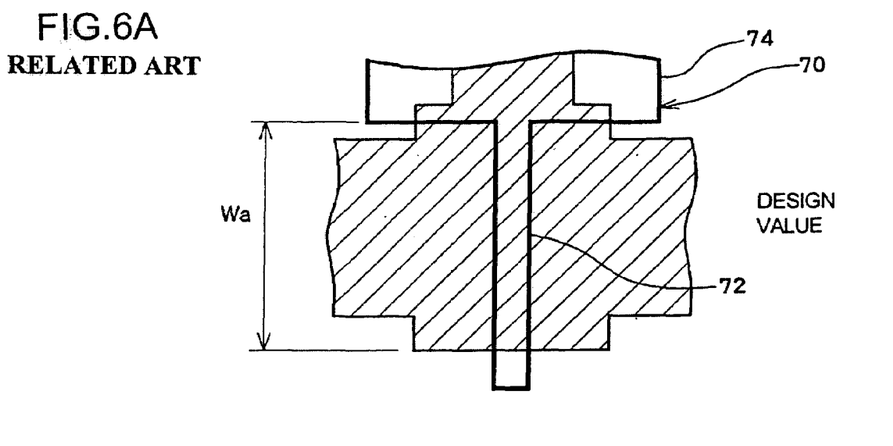
FIGS. 6(A) through 6(C) are schematic views for explaining that the mask shift causes fluctuations in the channel width with the conventional T-type gates.
Figure 6B:
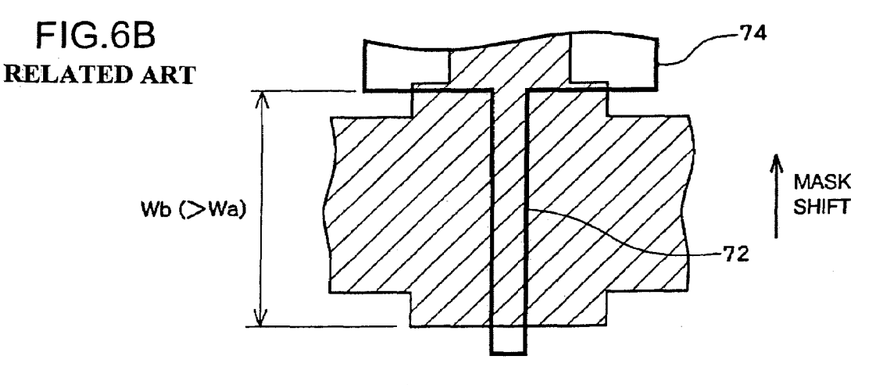
Figure 6C:
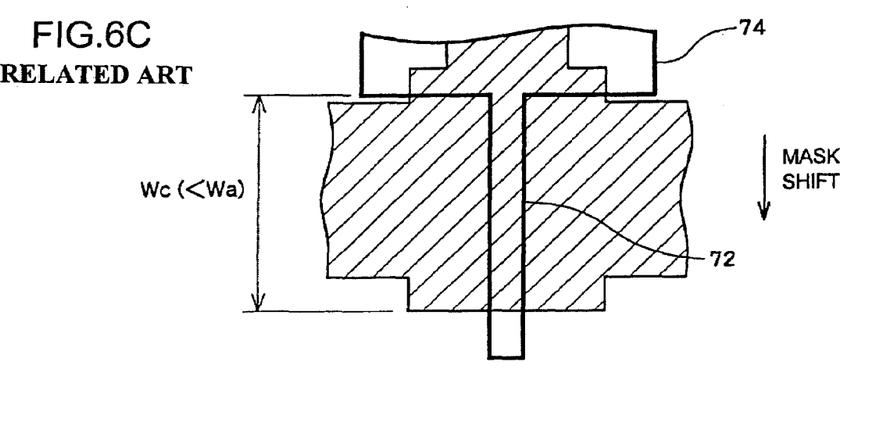

FIGS. 6(A) through 6(C) show fluctuations in the gate width caused by the mask shift in a conventional T-type gate. The T-type gate 70 has a first section 72 with a second section 74 attached on only one edge thereof. In this case, if the mask shift occurs, the length of portion of the first section 72 positioned on the field region varies in each of FIGS. 6(A) through 6(C) resulting in different gate widths of Wa, Wb, and Wc.

Another advantage of the exemplary embodiment is to increase gate capacitances by the H-type gate structure to enable the transistors to additionally have delay functions. In general, putting an operation speed ahead, it is desirable that gate capacitances of transistors are small. However, in case of, for example, SRAM, since the operation speed inside the memory cell 10 is given a less weight than the operation speed of peripheral circuits thereof as a problem, the operation speed can be dropped to be lower than, for example, the operation speed of the I-type gates with no additional gate section. On the contrary, problems may occur if delay functions are not actively implemented to transistors. One example of this case is described herein referring to FIG. 7.

Figure 7:
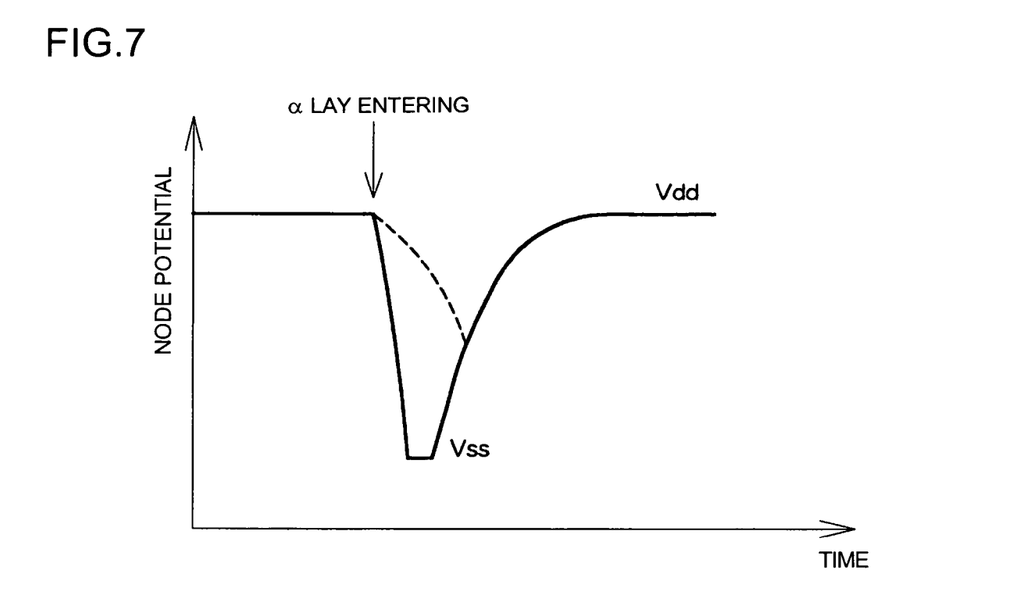
FIG. 7 is a chart showing a characteristic of the node potential in the memory cells in case a single-shot α lay enters thereto.

A solid line in FIG. 7 shows an alteration of the node potential inside the memory cell in case a single-shot α lay is input thereto. When the single-shot α lay enters the transistor with the node potential of HIGH (voltage of Vdd), as illustrated by the solid line in FIG. 7, the node potential alters to be LOW (voltage of Vss) for a very short period (e.g., a few ns/10). Although after then the charge generated by the α lay rapidly disappears by recombination and so on, once the node potential is inverted, the previous state of the memory is sometimes reversed by the flip-flop 16. This is more noticeable with the power source of the lower voltage.

In this case, if the gate capacitance C is increased in the H-type gate according to the present embodiment, another resistance component R as well as a delay circuit RC are formed. In this case, as illustrated by a broken line in FIG. 7, the timing of the node potential altering toward the Vss in response to the single-shot a lay entering thereto can be delayed, meanwhile electron-hole pairs created by the a lay can disappear to make the node potential rapidly return to initial HIGH (Vdd).

Accordingly, the H-type gates of the present embodiment are extremely advantageous in case the capacitances are necessary to be increased to cope with a problem such as a countermeasure for α lays. Because the H-type gates having themselves large gate capacitances in comparison with the conventional I-type gates or T-type gates do not require any additional sections for forming capacitances.

In case of the SOI structure as adopted in the present embodiment, the bodies 26 (See FIG. 4.) of the six transistors Q1 through Q6 are insulated from each other to be set to floating conditions. In contrast, the potentials of the bodies 26 are important factors for determining the threshold levels of the transistors. If the bodies are in floating conditions, the body potentials rise to Vdd at, for example, the switching timing when the source/drain regions 28 of the transmission transistors are set to Vdd. After then, at a "LOW" writing timing when the drains of the source/drain regions 28 become Vss potential, a large amount of positive charges flows into the bit lines BL or inverted bit lines/BL making it difficult to pull in to the Vss potential (pass-gate leakage). The pass-gate leakage causes so-called write disturbance in which one memory cell cannot be written as "LOW" if "HIGH" is written to almost all memory cells.

In view of the above, as shown in FIG. 3, the body contact regions 50 through 60 for setting potentials of the bodies 26 are provided on the transistors Q1 through Q6.

In this case, short circuit of the low resistance layers (e.g., silicide layers) formed on the surfaces of the source/drain region 28 and the body contact region can be prevented by one of the second sections of the H-type gate. For example, the second section 24A21 formed on the H-type gate 25A1 of the load transistor Q1 shown in FIG. 3 separates the low resistance layers provided on the surfaces of the source/drain region 28 and the body contact region 50 from each other. Likewise, one of the second sections of another H-type gate also separates the source/drain region 28 and the body contact region 50 from each other.

Although the above point is also true for the conventional T-type gates, the positions to which the body contacts are disposed are limited to the outsides of the second sections existing on one side in the gate width direction in case of T-type gates. In case of the H-type gates, the body contact regions can be disposed outside either one of the second sections provided on the both sides thereof in the gate width direction, thus enhancing freedom of layout.

Note that the invention is not limited to the exemplary embodiments described above, but can be variously modified to be practiced within the scope or spirit of the invention. For example, the invention is not limited to application to the SRAM, but can be applied to other transistors than transistors for forming memory sells. Also in this case, the width of the channel can be formed as designed to provide advantage in increasing the gate capacitance. Further, a semiconductor device and a semiconductor memory are not limited to those formed on the SOI substrates, but can be those formed on bulk substrates such as a silicon substrate. In this case, although the body contacts need not to be formed on every transistor, the channel width can be formed as designed, and the gate capacitance can be increased to enable the transistors to additionally have the delay functions.

What is claimed is:

1. A semiconductor device, comprising in a field region:
   a gate;
   a gate insulating film disposed right under the gate;
   a body region disposed right under the gate insulating film; and
   source and drain regions formed on both sides of the body region,
   the gate comprising a first section extending on the field region along the channel width direction, and a pair of second sections formed on both ends of the first section in the channel width direction and extending along the channel length direction, and is formed as an H-type gate in plan view, and
   a part of each of the pair of second sections of the H-type gate being formed on the field region having a constant length in the channel length direction to define the channel width by the length of the first section in the channel width direction; and
   the constant length in the channel length direction of the field region being shorter than a length in the channel length direction of the field region of a portion of the first section.

2. The semiconductor device according to claim 1, wherein the field region is formed on a SOI (Silicon On Insulator) substrate.

3. The semiconductor device according to claim 2, comprising a body contact disposed on the field region across one of the pair of second sections of the H-type gate from the first section.

4. The semiconductor device according to claim 3, comprising a low resistance layer formed on a surface of the field region.

5. The semiconductor device according to claim 1, the field region being formed on a bulk substrate.

6. A semiconductor memory comprising a memory cell at least including a pair of drive transistors and a pair of transmission transistors, wherein at least one of transistors forming the memory cell comprises in a field region the semiconductor device according to claim 1.

7. The semiconductor memory according to claim 6, wherein the field region is formed on a SOI (Silicon On Insulator) substrate.

8. The semiconductor memory according to claim 7, comprising a body contact disposed on the field region across one of the pair of second sections of the H-type gate from the first section.

9. The semiconductor memory according to claim 8, further comprising a low resistance layer formed on a surface of the field region.

10. The semiconductor memory according to claim 6, the field region being formed on a bulk substrate.

11. The semiconductor memory according to claim 6, each of the pair of transmission transistors comprising the H-type gate.

12. The semiconductor memory according to claim 11, the pair of H-type gates of the pair of transmission transistors being formed as a continuing pattern inside and outside of the field region.

13. The semiconductor memory according to claim 6, further comprising a pair of load transistors respectively connected in series to the pair of drive transistors, each of the pair of load transistors comprising the H-type gate.

14. The semiconductor memory according to claim 13, wherein one of the pair of H-type gates of one of the pair of load transistors and one of the pair of H-type gates of one of the pair of drive transistors connected in series to the one of the pair of load transistors are formed as a continuing pattern inside and outside of the field region, and the other of the pair of H-type gates of the other of the pair of load transistors and the other of the pair of H-type gates of the other of the pair of drive transistors connected in series to the other of the pair of load transistors are formed as a continuing pattern inside and outside of the field region.

15. The semiconductor memory according to claim 6, wherein the field region have a wide region overlapping the pair of second sections and a narrow region having smaller length than the wide region in the channel width direction,
the length of the narrow region in the channel width direction is smaller than channel width.

16. The semiconductor memory according to claim 15, wherein the length of the wide region in the channel length direction is smaller than the length of the second section in the channel length direction.

17. The semiconductor memory according to claim 15, comprising a body contact region disposed on the field region across one of the pair of second sections of the H-type gate from the first section,
the length of the body contact region in channel length is smaller than the length of the wide region in channel length direction.

18. The semiconductor memory according to claim 6, the length of the second section is smaller than the length of the field region in channel length direction.

19. The semiconductor memory according to claim 15, the narrow region does not overlap the pair of the second section.

* * * * *